(12) United States Patent  
Watakabe et al.

(10) Patent No.: US 12,176,438 B2  
(45) Date of Patent: Dec. 24, 2024

(54) SEMICONDUCTOR DEVICE

(71) Applicant: Japan Display Inc., Tokyo (JP)

(72) Inventors: Hajime Watakabe, Tokyo (JP); Kentaro Miura, Tokyo (JP); Toshinari Sasaki, Tokyo (JP); Takeshi Sakai, Tokyo (JP); Akihiro Hanada, Tokyo (JP); Masashi Tsubuku, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 447 days.

(21) Appl. No.: 17/549,882

(22) Filed: Dec. 14, 2021

(65) Prior Publication Data

US 2022/0190164 A1    Jun. 16, 2022

(30) Foreign Application Priority Data

Dec. 14, 2020   (JP) ................. 2020-206634

(51) Int. Cl.
*H01L 29/78* (2006.01)
*H01L 29/423* (2006.01)
*H01L 29/786* (2006.01)

(52) U.S. Cl.
CPC .... *H01L 29/7869* (2013.01); *H01L 29/42384* (2013.01)

(58) Field of Classification Search
CPC ........... H01L 29/7869; H01L 29/42384; H01L 29/66969; H01L 29/78633; H01L 27/1214–1296; H01L 29/78636; H01L 21/26513; H01L 21/266; H01L 27/127; H01L 29/66765; H01L 29/78678; H01L 2029/42388; H01L 29/423; H01L 29/78627; H01L 29/4908; H01L 29/66742–6678; H01L 29/786–78696; H01L 27/12–13; H01L 2924/13069;
(Continued)

(56) References Cited

U.S. PATENT DOCUMENTS

2013/0009149 A1*  1/2013  Endo .................. H01L 27/1218
                                                    257/E29.296
2017/0278872 A1   9/2017  Ohara
2020/0259020 A1   8/2020  Watakabe et al.

FOREIGN PATENT DOCUMENTS

JP        2017-28288 A      2/2017
JP        2017-183312 A    10/2017
(Continued)

OTHER PUBLICATIONS

Japanese Office Action issued Jul. 30, 2024, in corresponding Japanese Patent Application No. 2020-206634, 6pp.

*Primary Examiner* — Moin M Rahman
(74) *Attorney, Agent, or Firm* — XSENSUS LLP

(57) ABSTRACT

According to one embodiment, a semiconductor device includes an oxide semiconductor. The oxide semiconductor includes a first edge portion and a second edge portion intersecting a gate electrode, a first area overlapping the gate electrode, a second area along the first edge portion, a third area along the second edge portion, a fourth area the first edge portion, a fifth area along the second edge portion, a sixth area surrounded by the first area, the second area and the third area, and a seventh area surrounded by the first area, the fourth area and the fifth area. The first area, the second area and the third area, the fourth area and the fifth area have a higher resistivity than those of the sixth area and the seventh area.

10 Claims, 11 Drawing Sheets

(58) Field of Classification Search
CPC ... H01L 29/04–045; H01L 29/16–1608; H01L 29/18–185; H01L 29/22–2206; H01L 29/36–365; H01L 23/5226; H01L 23/528; H01L 29/41775; H01L 29/42324; H01L 29/4234; H01L 21/02532; H01L 21/02636; H01L 21/31111; H01L 21/31155; H01L 21/76802; H01L 21/76877; H01L 21/76897; H01L 29/40114; H01L 29/40117; H01L 29/66545; H01L 29/7883; H01L 21/76831; H01L 21/76805; H01L 29/78; B32B 2457/202; H05K 2201/10136; H10B 43/27; H10B 41/27; H10B 41/30; H10B 43/30; H10B 43/40; H10B 43/10; H10B 43/50; H10B 41/35; H10B 41/50; H10B 43/35; H10B 41/41; H10B 41/10; H10B 41/20; H10B 41/40; H10B 41/44; H10B 41/43; H10B 41/42; H10B 43/00; H10B 43/20; H10B 43/23; H10B 51/00; H10B 51/10; H10B 51/20; H10B 51/30; H10B 51/40; H10B 51/50; H10B 53/10; H10B 53/20; H10B 53/22; H10B 63/30; H10B 63/32; H10B 63/34; H10B 63/80; H10B 63/84; H10B 99/00; H10B 99/10; H10B 99/22

See application file for complete search history.

(56) References Cited

FOREIGN PATENT DOCUMENTS

| | | |
|---|---|---|
| JP | 2020-129635 A | 8/2020 |
| WO | 2016/175086 A1 | 11/2016 |

* cited by examiner

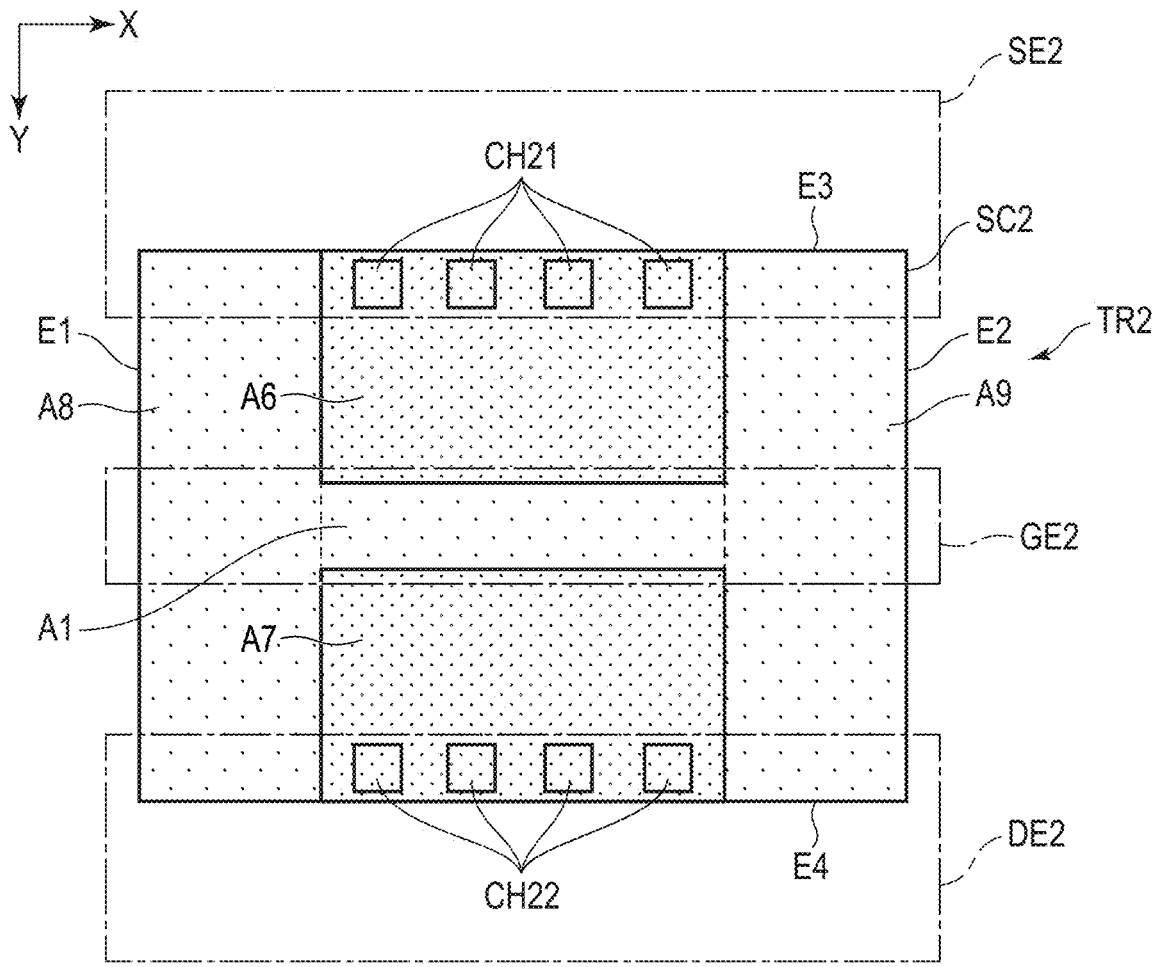
F I G. 12

SEMICONDUCTOR DEVICE

CROSS-REFERENCE TO RELATED APPLICATIONS

This application is based upon and claims the benefit of priority from Japanese Patent Application No. 2020-206634, filed Dec. 14, 2020, the entire contents of which are incorporated herein by reference.

FIELD

Embodiments described herein relate generally to a semiconductor device.

BACKGROUND

For example, in the field of the liquid crystal display, such a technology is proposed that a transistor comprising an oxide semiconductor is provided in a pixel circuit in a display area and a transistor comprising a silicon semiconductor is provided in a drive circuit in a peripheral area.

BRIEF DESCRIPTION OF THE DRAWINGS

FIG. 12 is a plan view showing still another example of the transistor TR2.

DETAILED DESCRIPTION

Figure 1:
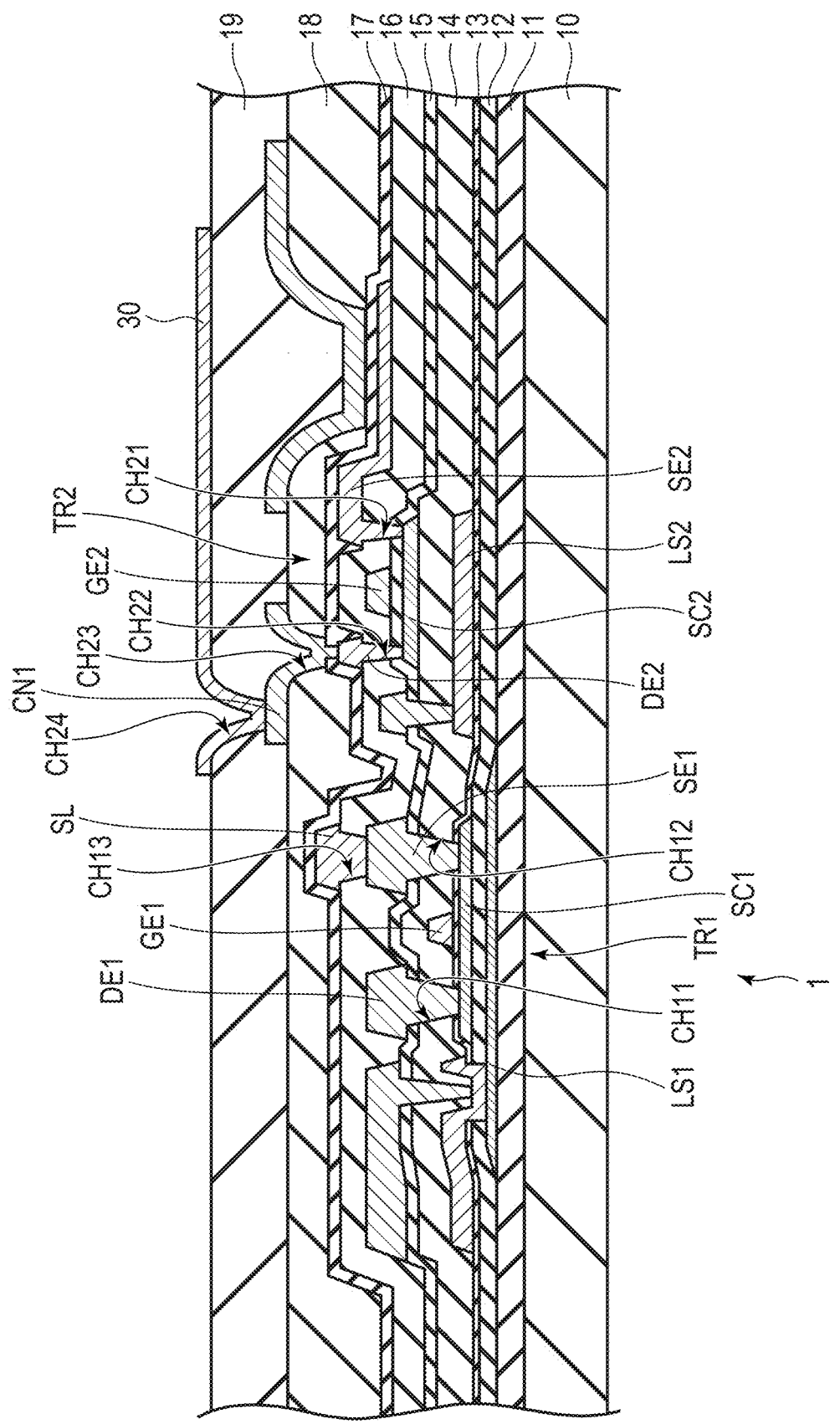
FIG. 1 is a cross-sectional view showing a configuration example of a semiconductor device 1 according to an embodiment.

In general, according to one embodiment, a semiconductor device comprises an insulating substrate, a first insulating layer disposed above the insulating substrate, an island-shaped oxide semiconductor disposed on the first insulating layer, a second insulating layer which covers the oxide semiconductor, a gate electrode disposed on the second insulating layer, a source electrode and a drain electrode, which are in contact with the oxide semiconductor, the oxide semiconductor including a first edge portion intersecting the gate electrode, a second edge portion on an opposite side to the first edge portion, which intersects the gate electrode, a first area extending along a first direction between the first edge portion and the second edge portion and overlapping the gate electrode, a second area located between the first area and the source electrode and along the first edge portion, a third area located between the first area and the source electrode and along the second edge portion, a fourth area located between the first area and the drain electrode and along the first edge portion, a fifth area located between the first area and the drain electrode and along the second edge portion, a sixth area surrounded by the first area, the second area and the third area and a seventh area surrounded by the first area, the fourth area, and the fifth area, and the first area, the second area, the third area, the fourth area and the fifth area have a higher resistance as compared to the sixth area and the seventh area.

Embodiments will be described hereinafter with reference to the accompanying drawings.

Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof may be omitted unless otherwise necessary.

Note that, in order to make the descriptions more easily understandable, some of the drawings illustrate an X axis, a Y axis and a Z axis orthogonal to each other. A direction along the X axis is referred to as an X direction or a first direction, a direction along the Y axis is referred to as a Y direction or a second direction and direction along the Z axis is referred to as a Z direction or a third direction. A plane defined by the X axis and the Y axis is referred to as an X-Y plane, and viewing towards the X-Y plane is referred to as planar view.

A semiconductor device 1 of this embodiment is applicable to various display devices such as liquid crystal displays, organic electroluminescent displays, electrophoretic displays, and LED displays, as well as various sensors such as capacitive sensors and optical sensors, and other electronic devices.

FIG. 1 is a cross-sectional view of a configuration example of the semiconductor device 1 of this embodiment.

The semiconductor device 1 comprises a base 10, insulating layers 11 to 19, transistors TR1 and TR2, and an element electrode 30.

The transistor TR1 comprises a semiconductor SC1, a gate electrode (first gate electrode) GE1, a source electrode (first source electrode) SE1, and a drain electrode (first drain electrode) DE1. The semiconductor SC1 is, for example, a polycrystalline silicon semiconductor, but it may be some other silicon semiconductor. The gate electrode GE1 is an electrode electrically connected to a respective gate line. The source electrode SE1 is an electrode electrically connected to a respective source line SL.

The transistor TR2 comprises a semiconductor SC2, a gate electrode (second gate electrode) GE2, a source electrode (second source electrode) SE2, and a drain electrode (second drain electrode) DE2. The semiconductor SC2 is, for example, an oxide semiconductor. The gate electrode GE2 is an electrode electrically connected to a respective gate line. The source electrode SE2 is an electrode electrically connected to a respective source line, power line or the like. The drain electrode DE2 is an electrode electrically connected to the element electrode 30.

The base 10 is an insulating substrate formed of an insulating material such as glass and resin film. The insulating layer 11 is disposed on the base 10.

The light-shielding layer LS1 is provided for the transistor TR1, and is disposed on the insulating layer 11 and covered by the insulating layer 12. The light-shielding layer LS1 is, for example, a metal layer. The semiconductor SC1 is located directly above the light-shielding layer LS1, is disposed on the insulating layer 12 and covered by the insulating layer 13.

The gate electrode GE1 is located directly above the semiconductor SC1, is disposed on the insulating layer 13 and covered by the insulating layer 14. The gate electrode GE1 is at the same potential as that of the light-shielding layer LS1, for example.

The source electrode SE1 and the drain electrode DE1 are located on the insulating layer 15 and covered by the insulating layer 16. The source electrode SE1 and the drain electrode DE1 are in contact with the semiconductor SC1 via contact holes CH11 and CH12, respectively, which penetrate the insulating layers 13 to 15.

The source line SL is disposed on the insulating layer 16 and is covered by the insulating layer 17. The source line SL is in contact with the source electrode SE1 via a contact hole CH13 that penetrates the insulating layer 16.

The light-shielding layer LS2 is provided for the transistor TR2, is disposed on the insulating layer 13 and covered by the insulating layer 14. The gate electrode GE1 and the light-shielding layer LS2 are located in the same layer and are metal layers formed of the same material. The semiconductor SC2 is located directly above the light-shielding layer LS2, is disposed on the insulating layer 14 and covered by the insulating layer 15.

The gate electrode GE2 is located directly above the semiconductor SC2, disposed on the insulating layer 15 and covered by the insulating layer 16. The gate electrode GE2 is at the same potential as that of the light-shielding layer LS2, for example. The gate electrode GE2, the source electrode SE1 and the drain electrode DE1 are metal layers located in the same layer and formed of the same material.

The source electrode SE2 and the drain electrode DE2 are located on the insulating layer 16 and are covered by the insulating layer 17. The source electrodes SE2 and the drain electrodes DE2 are in contact with the semiconductor SC2 via contact holes CH21 and CH22, respectively, that penetrate the insulating layers 15 and 16. The source electrode SE2, the drain electrode DE2 and the source line SL are metal layers located in the same layer and formed of the same material.

A connection electrode CN1 is located on the insulating layer 18 and is covered by the insulating layer 19. The connection electrode CN1 is in contact with the drain electrode DE2 via a contact hole CH23 that penetrates the insulating layers 17 and 18. The connection electrode CN1 is a transparent electrode formed of, for example, a transparent conductive material such as indium tin oxide (ITO) or indium zinc oxide (IZO), but it may as well be a metal layer.

The element electrode 30 is disposed on the insulating layer 19 and is in contact with the connection electrode CN1 via a contact hole CH24 that penetrates the insulating layer 19. The element electrode 30 constitutes a pixel electrode, a bottom electrode, an anode or a cathode of various electronic devices. The element electrode 30 is a transparent electrode formed of, for example, a transparent conductive material such as ITO or IZO. Note that the element electrode 30 may as well be a metal electrode formed of a metal material such as silver or aluminum. Further, the element electrode 30 may be of a stacked body of a transparent electrode and a metal electrode. For example, the element electrode 30 may be configured as a stacked body in which a transparent electrode, a metal electrode and a transparent electrode are stacked in this order, or may be configured as a stacked body consisting of three or more layers.

The insulating layers 11 to 17 are transparent inorganic insulating layers formed, for example, of silicon nitride (SiN), silicon oxide (SiO) and the like. Note that each of the insulating layers 11 to 17 may be a monolayer formed of a single insulating material or may be a stacked body formed of multiple insulating materials.

The insulating layers 18 and 19 are transparent organic insulating layers formed of polyimide or the like.

Next, an example of the transistor TR2 shown in FIG. 1 will be explained in more detail.

Figure 2:
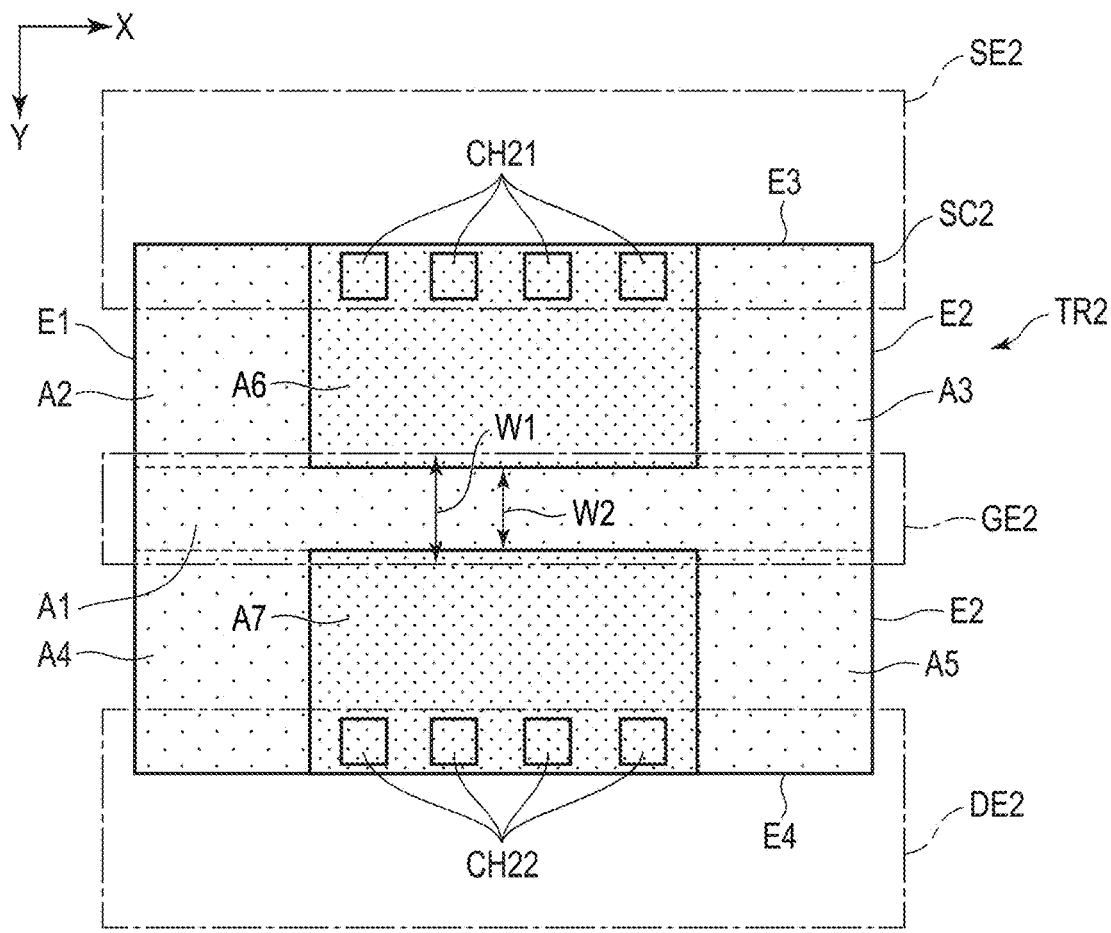
FIG. 2 is a plan view showing an example of a transistor TR2.

FIG. 2 is a plan view showing an example of the transistor TR2. In FIG. 2, the semiconductor SC2 is indicated by solid lines, and the gate electrode GE2, the source electrode SE2 and the drain electrode DE2 are each indicated by a dot chain lines.

The semiconductor SC2 is formed into an island shape, for example, a rectangular planar shape. The semiconductor SC2 includes an edge portion (first edge portion) E1 and an edge portion (second edge portion) E2 extending along the second direction Y, and an edge portion E3 and an edge portion E4 extending along the first direction X. The edge portion E2 is located on an opposite side to the edge portion E1 in the first direction X. The edge portion E4 is located on an opposite side to the edge portion E3 in the second direction Y. The shape of the semiconductor SC2 is not limited to that of the example illustrated in the figure.

The gate electrode GE2 extends along the first direction X and intersects the edge portions E1 and E2. The source electrode SE2 overlaps a region of the semiconductor SC2, which includes the edge portion E3. The drain electrode DE2 overlaps a region of the semiconductor SC2, which includes the edge portion E4. In the example shown in FIG. 2, the gate electrode GE2 is orthogonal to each of the edge portions E1 and E2, but it may as well intersect the edge portions E1 and E2 at an angle of less than 90°. The source electrode SE2 overlaps to include the entire edge portion E3, but may overlap a portion of the edge portion E3. Similarly, the drain electrode DE2 overlaps to include the entire edge portion E4, but may overlap a portion of the edge portion E4.

The semiconductor SC2 has areas A1 to A7. Each region will be described in detail below.

An area (first area) A1 extends along the first direction X between the edge portion E1 and the edge portion E2, and overlaps the gate electrode GE2. The area A1 includes a part of the edge portion E1 and also includes a part of the edge portion E2. In other words, in the area A1, one end portion along the first direction X corresponds to a part of the edge portion E1, and the other end portion along the first direction X corresponds to a part of the edge portion E2.

In planar view, the area A1 and the gate electrode GE2 do not necessarily overlap to completely match each other. In the example shown in FIG. 2, a width W1 of the gate electrode GE2 along the second direction Y is greater than a width W2 of the area A1 along the second direction Y between areas A6 and A7. The gate electrode GE2 has a substantially constant width W1 between the edge portion E1 and the edge portion E2. A part of the gate electrode GE2 overlaps areas A2 to A7, which will be described later.

The area (second area) A2 and the area (third area) A3 are located between the area A1 (or the gate electrode GE2) and the source electrode SE2. The area A2 is a region along the edge portion E1. The area A2 includes a part of the edge portion E1 and also includes a part of the edge portion E3. The area A3 is a region along the edge portion E2. The area A3 includes a part of the edge portion E2 and also includes a part of the edge portion E3. In the example shown in FIG. 2, the areas A2 and A3 are connected to the area A1.

The area (fourth area) A4 and the area (fifth area) A5 are located between the area A1 (or the gate electrode GE2) and the drain electrode DE2. The area A4 is a region along the edge portion E1. The area A4 includes a part of the edge portion E1 and also includes a part of the edge portion E4. The area A5 is a region along the edge portion E2. The area A5 includes a part of the edge portion E2 and also includes a part of the edge portion E4. In the example shown in FIG. 2, the areas A4 and A5 are connected to the area A1.

The area (sixth area) A6 is the region surrounded by the area A1, the area A2 and the area A3. The area A6 includes a part of the edge portion E3.

The area A7 (seventh area) is the region surrounded by the area A1, the area A4 and the area A5. The area A7 includes a part of the edge portion E4.

In comparison of the widths along the first direction X, the width of the area A6 and the width of area A7 are equivalent to each other, and the widths of the areas A2 to A5 are equivalent to each other, and the width of each of the areas A6 and A7 is greater than the width of each of the areas A2 to A5. In one example, the width of each of the areas A2 to A5 is about 2 μm.

The edge portion E1 is formed by respective edges of the areas A2, A1 and A4 aligned along the second direction Y. The edge portion E2 is formed by respective edges of the area A3, the area A1 and the area A5 aligned along the second direction Y. The edge portion E3 is formed by respective edges of the area A2, the area A6 and the area A3 aligned along the first direction X. The edge portion E4 is formed by respective edges of the area A4, the area A7 and the area A5 aligned along the first direction X.

In the semiconductor SC2, the areas A1 to A5 have higher resistance as compared to those of the areas A6 and A7. Note that the resistance values of the areas A1 to A5 are equivalent to each other, and the resistance values of the areas A6 and A7 are equivalent to each other.

In other aspects, the impurity concentration of each of the areas A6 and A7 is higher than the impurity concentration of each of the areas A1 to A5. The impurity concentration of each of the areas A6 and A7 is equivalent to those of each of the areas A1 to A5. For example, each of the areas A6 and A7 is doped with boron (B) as an impurity, whereas each of the areas A1 to A5 is not substantially doped with boron. The impurity concentrations in this specification can be expressed as the number of impurities per unit volume.

Note that as to oxide semiconductors, a high impurity concentration means a large number of oxygen defects per unit volume or a large number of defects per unit volume.

The source electrode SE2 overlaps the area A2, the area A6 and the area A3 thereover in planar view. However, the source electrode SE2 is in contact with the area A6 via the contact holes CH21 that penetrates the insulating layers 15 and 16 shown in FIG. 1, without being in contact with the areas A2 and A3. No contact holes are formed that penetrate the insulating layers 15 and 16 to the areas A2 and A3. That is, the source electrode SE2 is in contact with the area A6, which is a low-resistance area (source region) of the semiconductor SC2, and is not in contact with the areas A2 and A3, which are high-resistance areas.

The drain electrode DE2 overlaps the area A4, the area A7 and the area A5 thereover in planar view. However, the drain electrode DE2 is in contact with the area A7 via the contact holes CH22 that penetrates the insulating layers 15 and 16 without being in contact with the areas A4 and A5. No contact holes are formed to penetrate the insulating layers 15 and 16 to the areas A4 and A5. That is, the drain electrode DE2 is in contact with the area A7, which is a low-resistance area (drain region) of the semiconductor SC2, and is not in contact with the areas A4 and A5, which are high-resistance regions.

Figure 3:
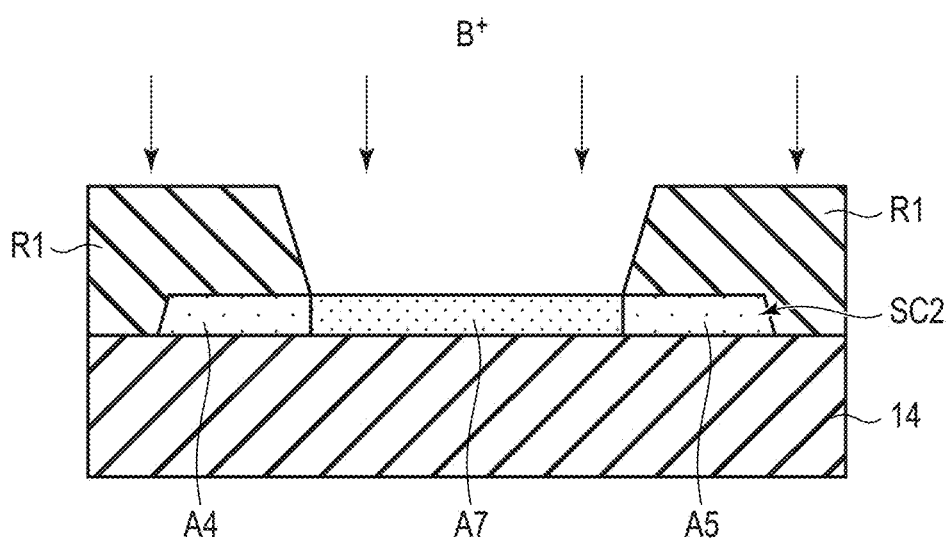
FIG. 3 is a diagram showing an example of a method of manufacturing a semiconductor SC2 shown in FIG. 2.

Next, an example of the method of manufacturing the semiconductor SC2 described above will be explained with reference to FIG. 3.

First, an oxide semiconductor film is formed on the insulating layer 14 (or silicon oxide layer), and the oxide semiconductor film is patterned into a predetermined shape by etching. Thus, an island-shaped semiconductor SC2 is formed.

Then, on the semiconductor SC2, a resist R1 patterned into a desired shape is formed. The resist R1 overlap a region of the semiconductor SC2, where the areas A4 and A5 are to be formed. The resist R1 does not overlap a region of the semiconductor SC2, where the area A7 is to be formed. Note that the resist R1 overlaps the region where the areas A1 to A3 shown in FIG. 2 are to be formed, but it does not overlap the region where the area A6 is to be formed.

Subsequently, using the resist R1 as a mask, ion implantation is carried out on the semiconductor SC2. For example, boron (B) is doped into the semiconductor SC2 as an impurity by ion implantation. In place of boron, other impurities such as phosphorus (P) and the like may be doped into the semiconductor SC2. As a result, the areas A1 to A5, where substantially no impurities are doped, and the areas A6 and A7, where impurities are doped, are formed in the semiconductor SC2. In the semiconductor SC2, for example, the area A1 corresponds to the channel region, the area A6 corresponds to the source region and the area A7 corresponds to the drain region.

Subsequently, after removing the resist R1, silicon oxide is deposited to form the insulating layer 15, and then the gate electrode GE2 is formed on the insulating layer 15. At this time, the gate electrode GE2 is patterned so as to overlap the area A1. In the manufacturing method in the example provided here, the ion implantation into the semiconductor SC2 does not use the gate electrode GE2 as a mask, but uses the resist R1 as the mask. For this reason, as mentioned above, the width W1 of the gate electrode GE2 does not necessarily match the width W2 of the area A1, which is the channel region. In order to ensure that the gate electrode GE2 overlaps the entire area A1, the width W1 is set to be larger than the width W2. In other words, the gate electrode GE2 overlaps the entire area A1, as well as a part of the area A6 and a part of the area A7.

According to the transistor TR2 described above, in the semiconductor SC2, a current path can be formed between the areas A6 and A7 which interpose the area A1 therebetween. The areas A2 and A4 along the edge portion E1, which intersect the gate electrode GE2, and the areas A3 and A5 along the edge portion E2, which intersect the gate electrode GE2 have a high resistance equivalent to that of the area A1, which is the channel region. For this reason, the areas A2 to A5 cannot become current paths.

That is, when a gate voltage higher than or equal to a threshold value is applied to the gate electrode GE2, a current flows between the source electrode SE2 and the drain electrode DE2 via the areas A1, A6 and A7 in the semiconductor SC2. On the other hand, substantially no current flows through the areas A2 to A5 in semiconductor SC2.

Thus, heat generation in the areas A2 to A5 is suppressed, and degradation caused by the heat generation in these areas is suppressed. In particular, the areas A2 and A4 including the edge portion E1, and the areas A3 and A5 including the edge portion E2 are susceptible to damage by etching during the formation of the island-shaped semiconductor SC2, and also to degradation due to heat generation caused by the flow of electric current. Therefore, it is effective to suppress the degradation in these areas by making the areas A2 to A5 highly resistive to make it difficult for electric current to flow.

Further, even if the areas A2 to A5 are degraded, these areas are not originally used to form a current path, and therefore the characteristics of the transistor TR2, for example, the shift in threshold voltage are suppressed. Thus, the degradation in reliability can be suppressed.

Figure 4:
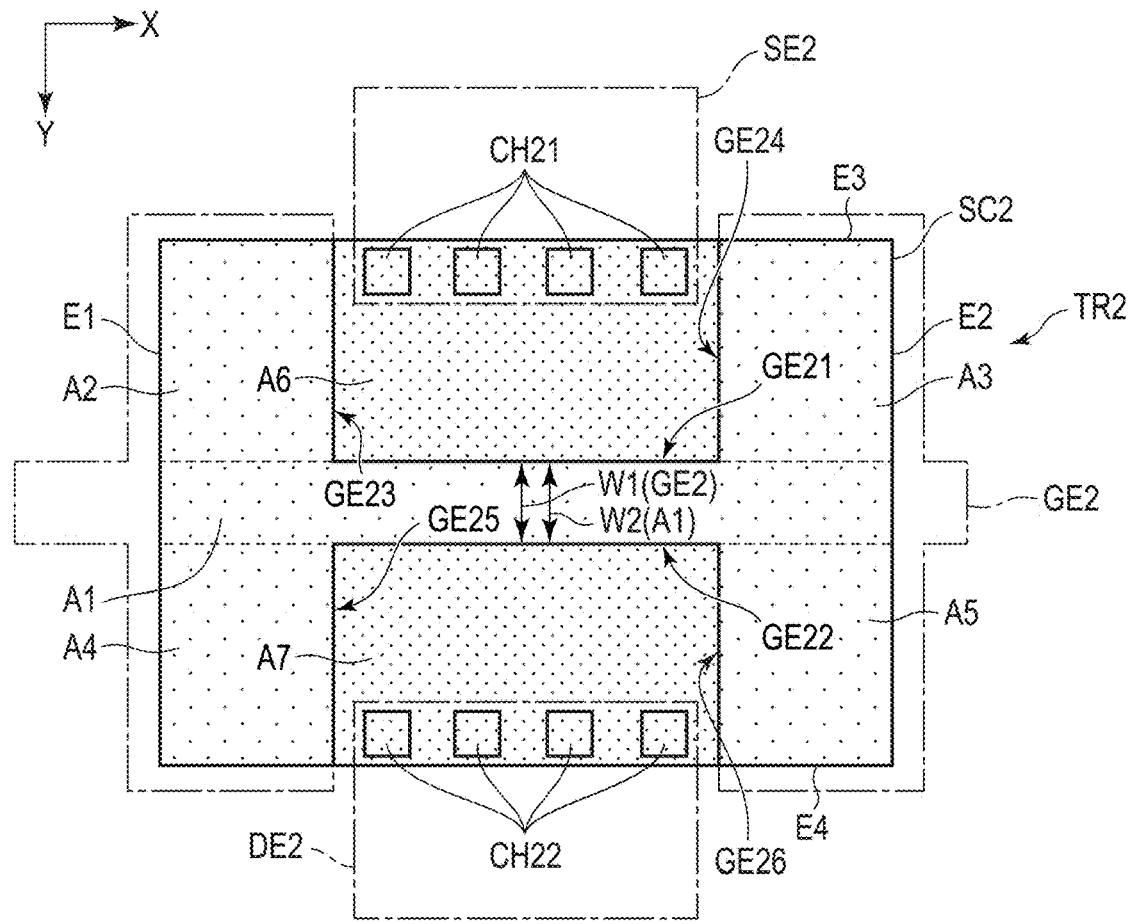
FIG. 4 is a plan view showing another example of the transistor TR2.

FIG. 4 is a plan view showing another example of the transistor TR2. The example shown in FIG. 2 is different from that of FIG. 4 in that the width W1 of the gate electrode GE2 is equivalent to the width W2 of the area A1 between the areas A6 and A7. The shape of each of the areas A1 to A7 in the semiconductor SC2 is as described with reference to FIG. 2, and the areas A2 to A5 are each connected to the area A1.

In planar view, the boundary between the area A1 and the area A6 overlaps one edge portion GE21 of the gate electrode GE2 along the first direction X, and the boundary between the area A1 and the area A7 overlaps the other edge portion GE22 of the gate electrode GE2 along the first direction X.

In the example shown in FIG. 4, the gate electrode GE2 overlaps not only the area A1 but also each of the areas A2 to A5. In planar view, the boundary between the area A2 and the area A6 overlaps an edge portion GE23 of the gate electrode GE2 along the second direction Y, the boundary between the area A3 and the area A6 overlaps an edge portion GE24 of the gate electrode GE2 along the second direction Y, the boundary between the area A4 and the area A7 overlaps an edge portion GE25 of the gate electrode GE2 along the second direction Y, and the boundary between the area A5 and the area A7 overlaps the edge portion GE26 of the gate electrode GE2 along the second direction Y.

The source electrode SE2 overlaps the area A6 in planar view, and does not overlap the areas A2 and A3, or the gate electrode GE2. The source electrode SE2 is in contact with the area A6 via the contact holes CH21.

The drain electrode DE2 overlaps the area A7 in planar view, and does not overlap the areas A4 and A5, or the gate electrode GE2. The drain electrode DE2 is in contact with the area A7 via the contact holes CH22.

Next, an example of the method of manufacturing the semiconductor SC2 described above will be explained with reference to FIG. 5.

First, an oxide semiconductor film is formed on the insulating layer 14 (or silicon oxide layer), and the oxide semiconductor film is patterned. Thus, an island-shaped semiconductor SC2 is formed.

Then, silicon oxide is deposited to form an insulating layer 15, and then, a gate electrode GE2 is formed on the insulating layer 15. The gate electrode GE2 overlaps the region of the semiconductor SC2, where the areas A4 and A5 are to be formed. The gate electrode GE2 does not overlap the region of the semiconductor SC2, where the area A7 should be formed. Note that the gate electrode GE2 overlaps the region where the areas A1 to A3 shown in FIG. 4 are to be formed, whereas it does not overlap the region where the area A6 is to be formed.

Subsequently, using the gate electrode GE2 as a mask, ion implantation is carried out on the semiconductor SC2. Thus, the areas A1 to A5, where impurities are not substantially doped, and areas A6 and A7, which impurities are doped, are each formed in the semiconductor SC2. In the manufacturing method in the example provided here, the gate electrode GE2 is used as a mask for the ion implantation into the semiconductor SC2. For this reason, as described above, the width W1 of the gate electrode GE2 matches the width W2 of the area A1, which is the channel region. Further, the gate electrode GE2 overlaps each of the areas A1 to A5.

Figure 5:
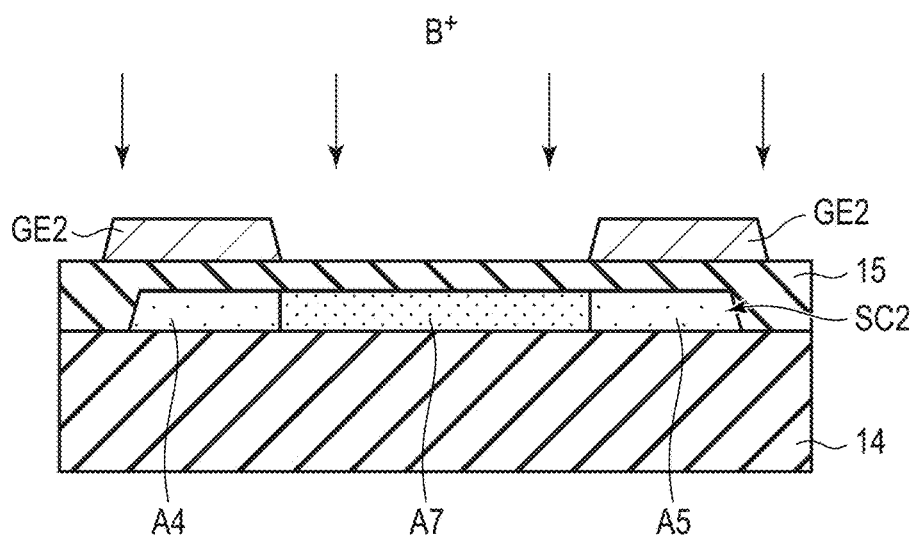
FIG. 5 is a diagram showing an example of a method of manufacturing a semiconductor SC2 shown in FIG. 4.

In the transistor TR2 described with reference to FIGS. 4 and 5, advantageous effects similar to those described above can be obtained.

Figure 6:
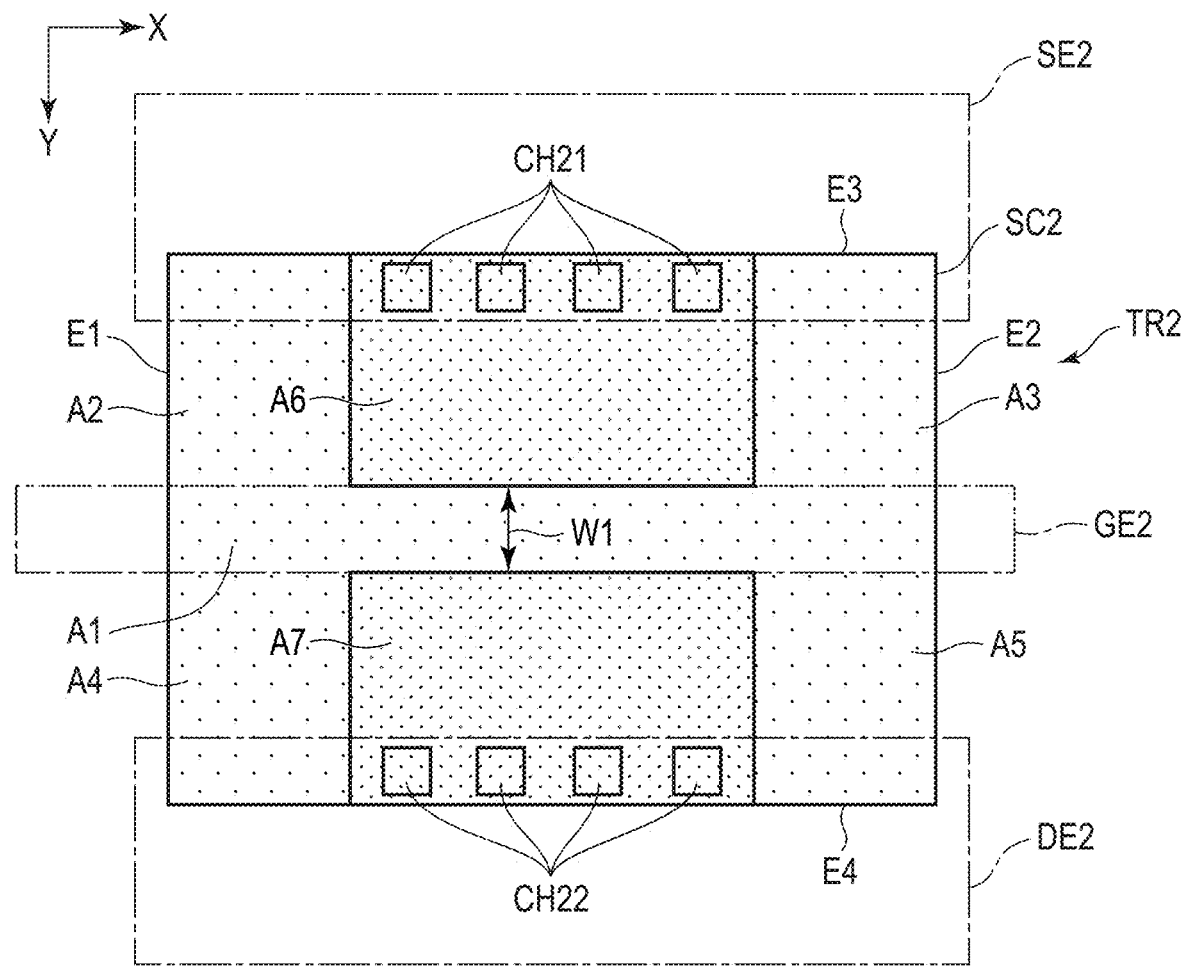
FIG. 6 is a plan view showing still another example of the transistor TR2.

FIG. 6 is a plan view of another example of transistor TR2. The example shown in FIG. 6 is different from that of FIG. 4 in that the gate electrode GE2 overlaps the area A1, but does not overlap the areas A2 to A5. The gate electrode GE2 has a substantially constant width W1 between the edge portions E1 and E2.

The source electrode SE2 overlaps the area A2, the area A6 and the area A3 thereover in planar view, and is in contact with the area A6 via the contact holes CH21 without being in contact with the areas A2 and A3.

The drain electrode DE2 overlaps the area A4, the area A7 and the area A5 thereover in planar view, and is in contact with the area A7 via the contact holes CH22 without being in contact with the areas A4 and A5.

The gate electrode GE2 of such shape is formed, for example, as follows. That is, as described with reference to FIG. 5, the gate electrode GE2 is patterned so as to overlap the region in the semiconductor SC2, where the areas A1 to A5 are to be formed. After that, using the gate electrode GE2 as a mask, ion implantation is carried out on the semiconductor SC2. Then, the portion of the gate electrode GE2, which overlaps the areas A2 to A5 is removed by etching. Thus, the gate electrode GE2 having the shape shown in FIG. 6 is formed.

Figure 7:
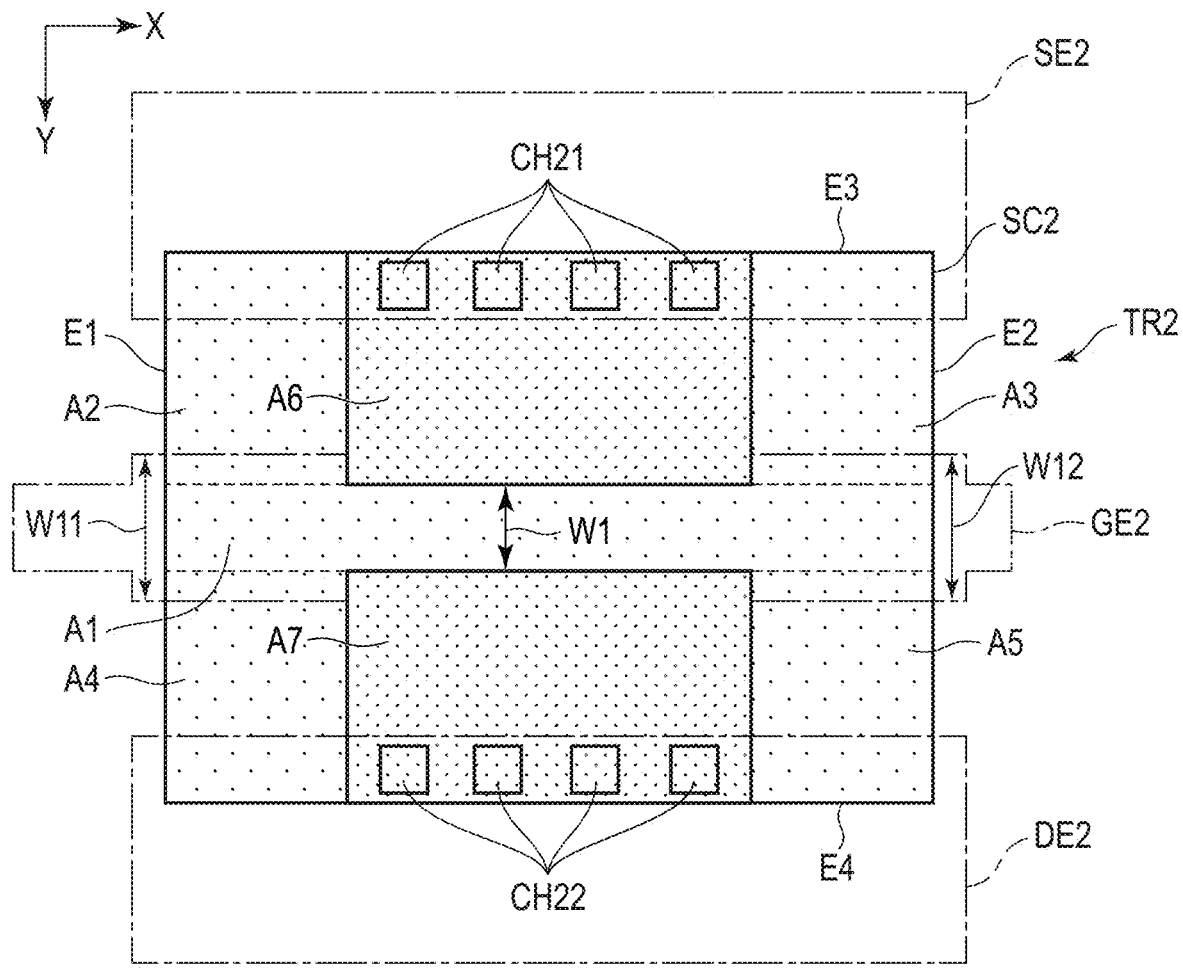
FIG. 7 is a plan view showing still another example of the transistor TR2.

FIG. 7 is a plan view showing another example of transistor TR2. The example shown in FIG. 7 is different from that of FIG. 6 in that the width of a portion of the gate electrode GE2 is enlarged. In other words, the gate electrode GE2 has a width W1 between the areas A6 and A7, a width W11 at a location intersecting the edge portion E1, and a width W12 at a location intersecting the edge portion E2 in planar view. The widths W11 and W12 are greater than the width W1.

That is, on a side proximate to the edge portion E1, the gate electrode GE2 overlap not only the area A1 but also a part of the area A2 and a part of the area A4. On a proximate to the edge portion E2, the gate electrode GE2 overlaps not only the area A1, but also a part of the area A3 and a part of the area A5.

Figure 8:
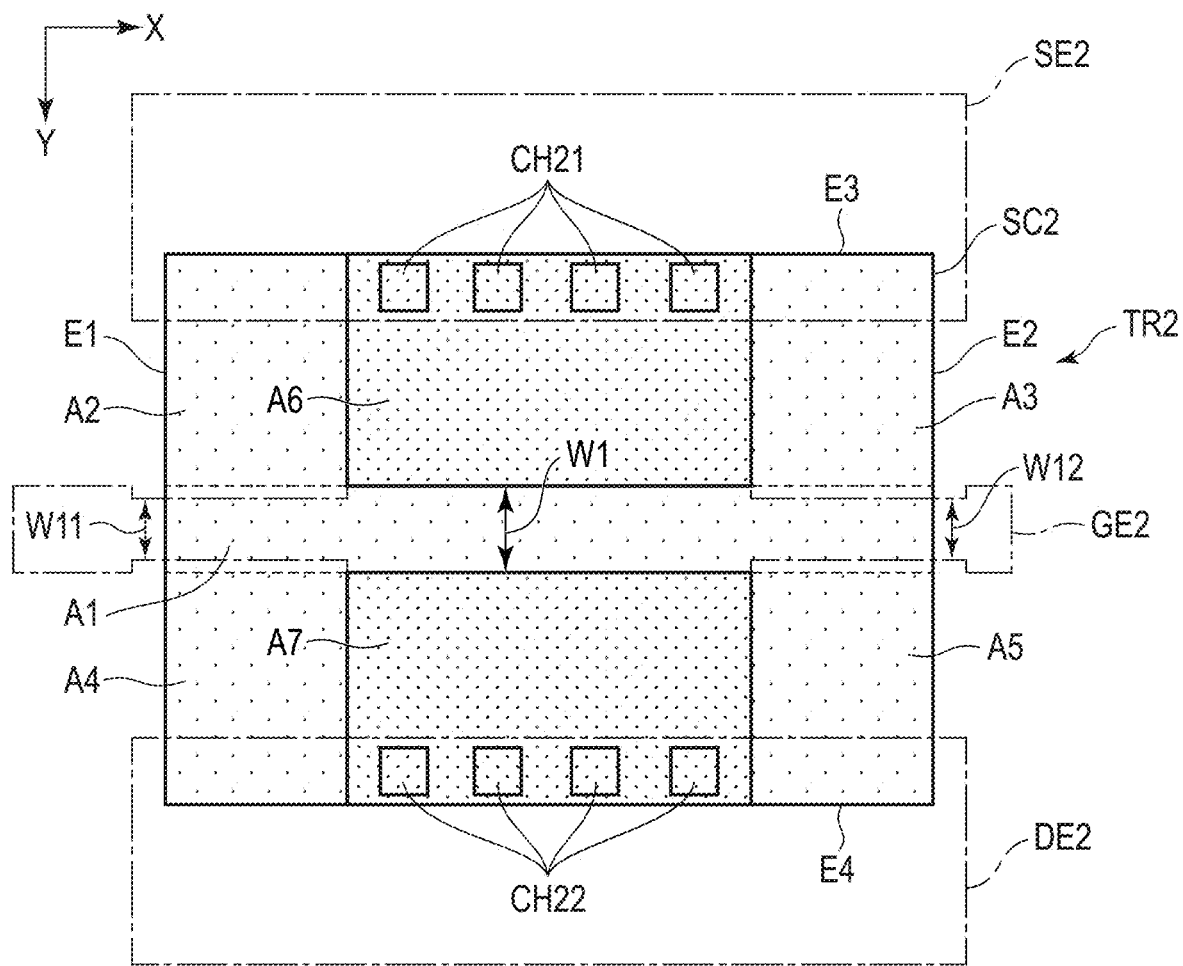
FIG. 8 is a plan view showing still another example of the transistor TR2.

FIG. 8 is a plan view showing another example of transistor TR2. The example shown in FIG. 8 is different from that of FIG. 6 in that the width of a part of the gate electrode GE2 is reduced. That is, in the gate electrode GE2, the width W11 at a location intersecting the edge portion E1 and the width W12 at a location intersecting the edge portion E2 are less than the width W1 between the areas A6 and A7.

In other words, on the side proximate to the edge portion E1, the gate electrode GE2 overlaps a part of the area A1, but does not overlap the areas A2 and A4. On the side proximate to the edge portion E2, the gate electrode GE2 overlaps a part of the area A1, but does not overlap the areas A3 and A5.

In the transistor TR2 described with reference to FIGS. 6 to 8, advantageous effects similar to those described above can be obtained.

Figure 9:
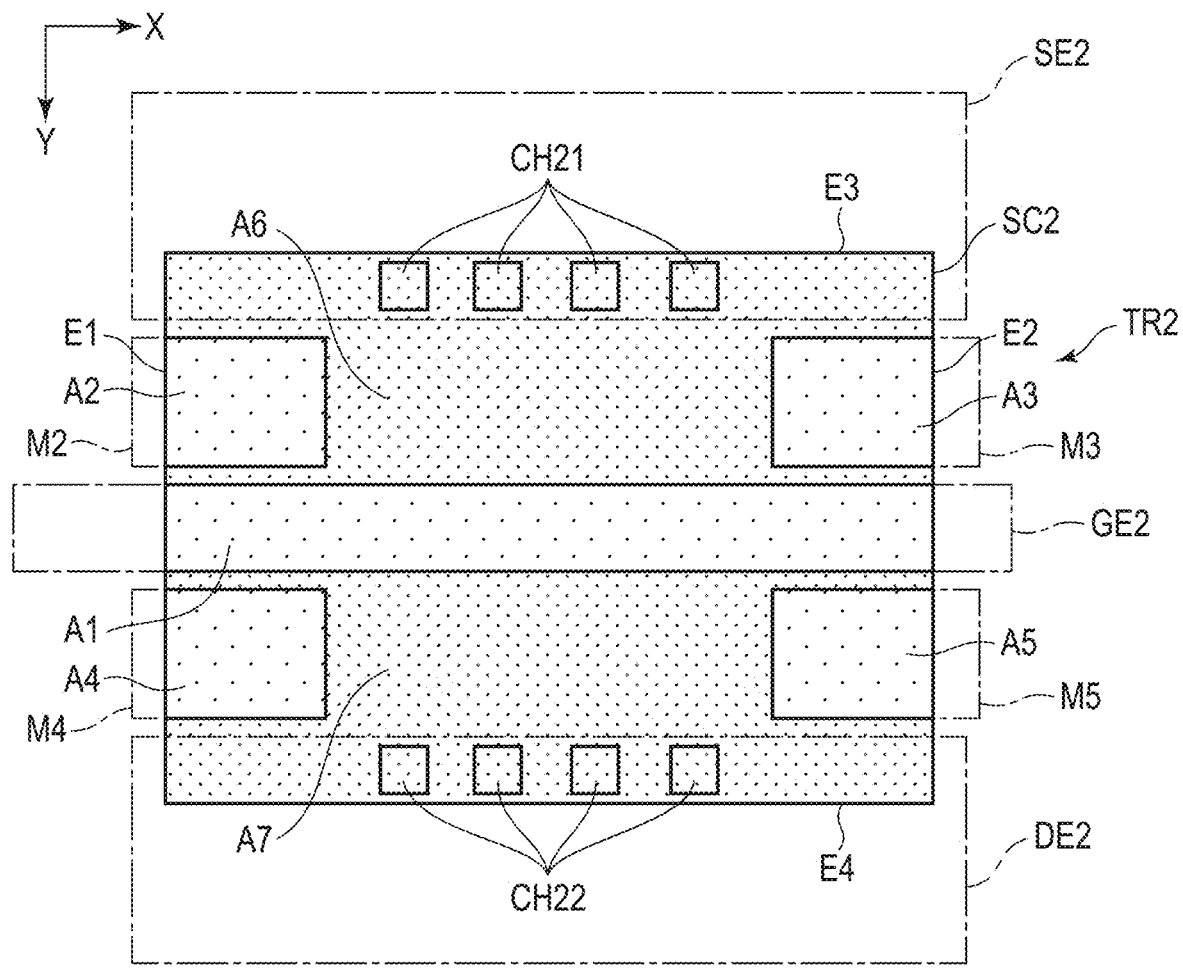
FIG. 9 is a plan view showing still another example of the transistor TR2.

FIG. 9 is a plan view showing another example of transistor TR2. The example shown in FIG. 9 is different from that of FIG. 6 in that each of the areas A2 to A5 is separated from the area A1 in the semiconductor SC2.

The areas A2 and A3 are located between the area A1 (or gate electrode GE2) and the source electrode SE2, and do not overlap either one the gate electrode GE2 and the source electrode SE2. The area A2 includes a part of the edge portion E1 and does not include the edge portion E3. The area A3 includes a part of the edge portion E2 and does not include the edge portion E3. Between the areas A1 and A2, and between the areas A1 and A3, a region having a lower resistance than that of the area A1 (or a region having a higher impurity concentration than that of the area A1) is interposed.

The regions A4 and A5 are located between area A1 (or gate electrode GE2) and drain electrode DE2, and do not overlap either one of the gate electrode GE2 and the drain electrode DE2. The area A4 includes a part of the edge portion E1 and does not include the edge portion E4. The area A5 includes a part of the edge portion E2 and does not include the edge portion E4. Between the areas A1 and A4 and between the areas A1 and A5, a region having a lower resistance than that of the area A1 (or a region having a higher impurity concentration than that of the area A1) is interposed.

Island-shaped metal layers M2 to M5 overlap the areas A2 to A5, respectively. The metal layers M2 to M5 are located in the same layer as the gate electrode GE2 and are formed of the same material as that of the gate electrode GE2. In other words, the metal layers M2 to M5 and the gate electrode GE2 can be formed in the same process in bulk.

The metal layers M2 and M3 are located between the gate electrode GE2 and the source electrode SE2, and do not overlap either one of the gate electrode GE2 and the source electrode SE2. The metal layers M4 and M5 are located between the gate electrode GE2 and the drain electrode DE2, and do not overlap either one of the gate electrode GE2 and the drain electrode DE2. With this configuration, the metal layers M2 to M5 are electrically floating, but are hardly affected by the potential of any one of the gate electrode GE2, the source electrode SE2 and the drain electrode DE2.

The semiconductor SC2 including the areas A1 to A7 having such configuration as above can be formed by ion implantation using the gate electrode GE2 and the metal layers M2 to M5 as masks. After the ion implantation, the metal layers M2 to M5 may be removed.

In the transistor TR2 described with reference to FIG. 9, no current path is formed in the vicinities of the edge portion E1 and the edge portion E2 in the semiconductor SC2, and therefore advantageous effects similar to those described above can be obtained.

Figure 10:
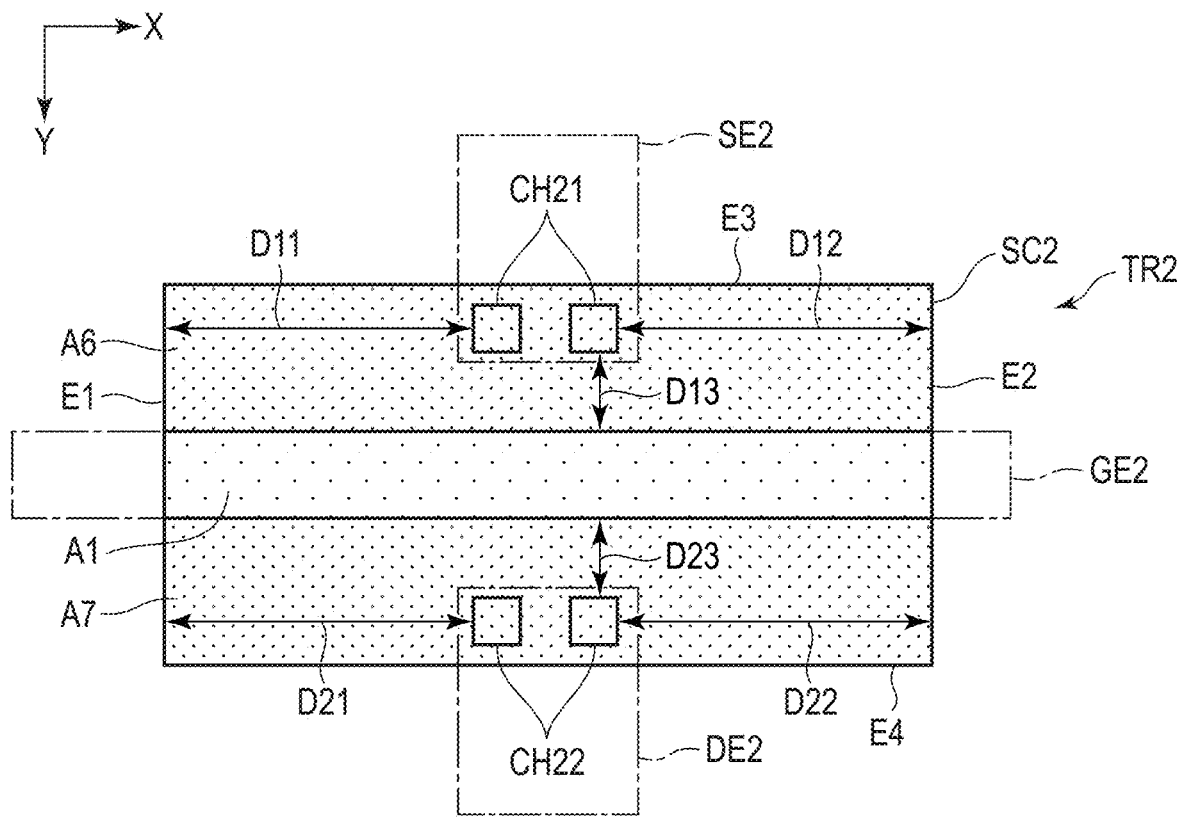
FIG. 10 is a plan view showing still another example of the transistor TR2.

FIG. 10 is a plan view showing another example of transistor TR2. In the example shown in FIG. 10, the semiconductor SC2 includes an area A1 corresponding to the channel region, an area A6 corresponding to the source region and an area A7 corresponding to the drain region, and does not include the above high-resistance areas A2 to A5 described above.

The source electrode SE2 overlaps the semiconductor SC2 at a substantially middle position between the edge portion E1 and the edge portion E2 in planar view, and is in contact with the area A6 via the contact holes CH21. A distance D11 from the edge portion E1 to the contact holes CH21, taken along the first direction X is equivalent to a distance D12 from the edge portion E2 to the contact holes CH21, taken along the first direction X. A distance D13 from the area A1 to the contact holes CH21, taken along the second direction Y is less than the distances D11 and D12. For example, the distances D11 and D12 are twice times or more the distance D13.

The drain electrode DE2 overlaps the semiconductor SC2 at a substantially middle position between the edge portion E1 and the edge portion E2 in planar view, and is in contact with the area A7 via the contact holes CH22. A distance D21 from the edge portion E1 to the contact holes CH22, taken along the first direction X is equivalent to a distance D22 from the edge portion E2 to the contact holes CH22, taken along the first direction X. A distance D23 from the area A1 to the contact holes CH22, taken along the second direction Y is less than the distances D21 and D22. For example, the distances D21 and D22 are two times or more the distance D23.

In the transistor TR2 described with reference to FIG. 10, when a gate voltage higher than or equal to the threshold value is applied to the gate electrode GE2, lines of electric force between the source electrode SE2 and the drain electrode DE2 are concentrated in a central portion of the semiconductor SC2, and the lines of electric force are not spread in the vicinity of the edge portion E1 and in the vicinity of the edge portion E2. Therefore, a current path is formed in the central portion of the semiconductor SC2, where the source electrode SE2 and the drain electrode DE2 are mainly located, and substantially no current flows in the vicinity of the edge portion E1 and in the vicinity of the edge portion E2. Therefore, advantageous effects similar to those described above can be obtained.

Figure 11:
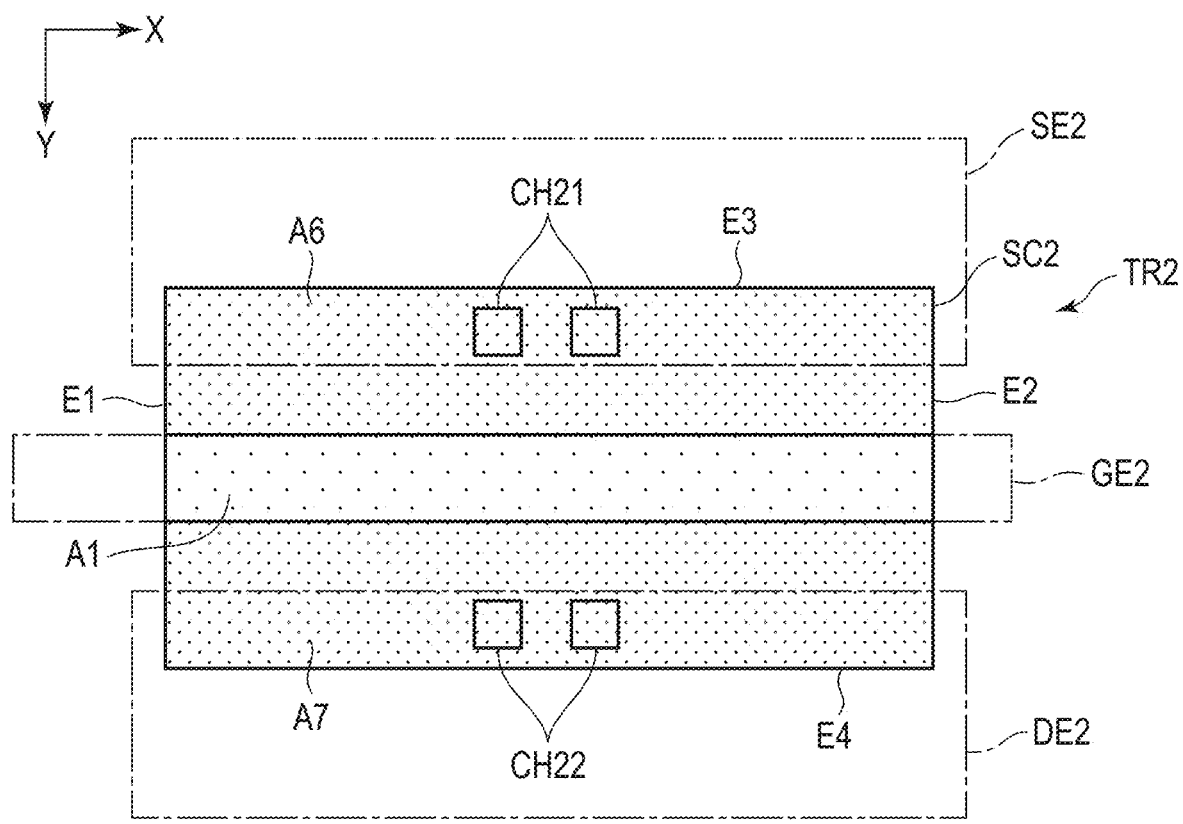
FIG. 11 is a plan view showing still another example of the transistor TR2.

FIG. 11 is a plan view showing another example of transistor TR2. The example shown in FIG. 11 is different from that of FIG. 10 in that the source electrode SE2 and the drain electrode DE2 are formed wider.

The source electrode SE2 is arranged so as to overlap the entire edge portion E3. Note that the source electrode SE2 is in contact with the area A6 via contact holes CH21 formed at positions sufficiently distant from the edge portions E1 and E2, as in the example shown in FIG. 10.

The drain electrode DE2 is arranged so as to overlap the entire edge portion E4. Note that as in the example shown in FIG. 10, the drain electrode DE2 is in contact with the area A7 via contact holes CH22 formed at positions sufficiently distant from the edge portions E1 and E2.

In the transistor TR2 in the example shown in FIG. 11, advantageous effects similar to those described above can be obtained.

FIG. 12 is a plan view showing another example of the transistor TR2. The example shown in FIG. 12 differs in that the area A8 along the edge portion E1 and the area A9 along the edge portion E2 are formed thinner than the areas in the central portion (namely, the areas A1, A6, and A7) in the semiconductor SC2. The width of each of the areas A8 and A9, taken along the first direction X is about 2 μm.

The source electrode SE2 overlaps the area A8, the area A6 and the area A9 thereover in planar view, and is in contact with the area A6 via the contact holes CH21 without being in contact with the areas A8 and A9.

The drain electrode DE2 overlaps the area A8, the area A7 and the area A9 thereover in planar view, and is in contact with the area A7 via the contact holes CH22 without being in contact with the areas A8 and A9.

Figure 13:
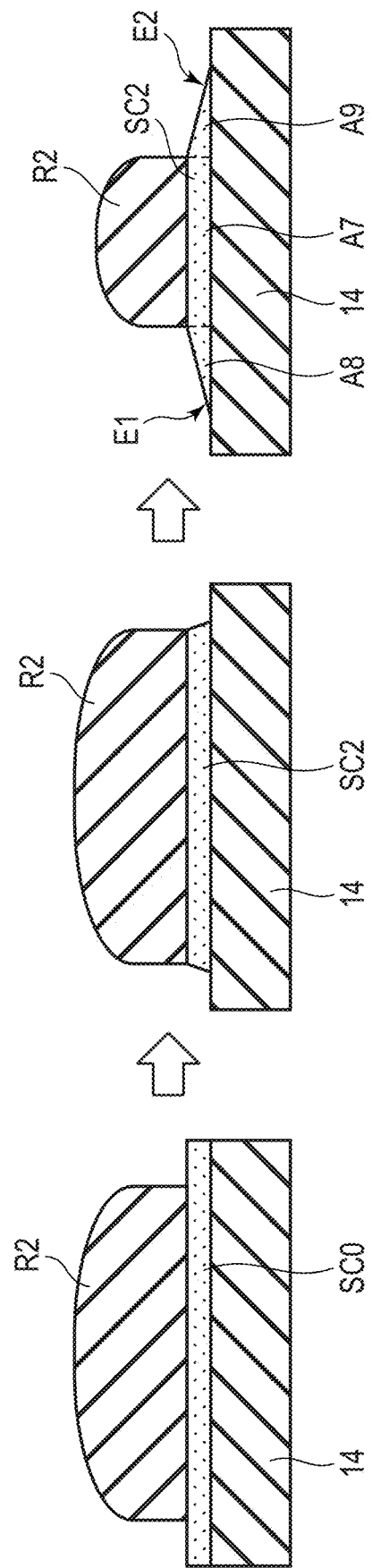
FIG. 13 is a diagram showing an example of a method of manufacturing a semiconductor SC2 shown in FIG. 12.

Next, an example of the method of manufacturing the semiconductor SC2 described above will be described with reference to FIG. 13.

First, an oxide semiconductor film SC0 is formed on the insulating layer 14. Then, on the oxide semiconductor film SC0, a resist R2 patterned into a desired shape is formed. Then, the oxide semiconductor film SC0 is etched using the resist R2 as a mask. Thus, the island-shaped semiconductor SC2 is formed.

Further, as the etching is continuously carried out (or an ashing process is carried out), the volume of the resist R2 is reduced (shrinking). Thus, the region in the vicinity of the edge portion E1 and the region in the vicinity of the edge portion E2 of the semiconductor SC2 are exposed from the resist R2, and the surface layer of the semiconductor SC2 is removed.

In the area A8, the etching time of the region in the vicinity of the edge portion E1 is longer than the etching time of the region in the vicinity of the edge portion A7. Therefore, the film thickness of the region in the vicinity of the edge portion E1 is less thinner than that of the region in the vicinity of the area A7.

Similarly, in the area A9, the etching time of the region in the vicinity of the edge portion E2 is longer than the etching time of the region in the vicinity of the area A7. Therefore, the film thickness of the region in the vicinity of the edge portion E2 is less than the film thickness of the region in the vicinity of the area A7.

On the other hand, the film thickness in the central portion of the semiconductor SC2 does not substantially change because the resist R2 overlaps there. This region forms the areas A1, A6 and A7 shown in FIG. 12.

In the semiconductor SC2 of such a shape, when ion implantation is carried out using the gate electrode GE2 as a mask, impurities are doped in the regions of the areas A8 and A9, that do not overlap the gate electrode GE2 as in the case of the areas A6 and A7. Note here that the film thickness in the vicinity of the edge portion E1 and the film thickness in the vicinity of the edge portion E2 are extremely thin, and the resistance is not lowered as in the case of the areas A6 and A7. Therefore, substantially no current flows in the vicinities of the edge portion E1 and the edge portion E2 of the semiconductor SC2, advantageous effects similar to those described above can be obtained.

As described above, according to the embodiments, it is possible to provide a semiconductor device in which the degradation of reliability can be suppressed.

Based on the semiconductor device which has been described in the above-described embodiments, a person having ordinary skill in the art may achieve a semiconductor device with an arbitral design change; however, as long as they fall within the scope and spirit of the present invention, such a semiconductor device is encompassed by the scope of the present invention.

A skilled person would conceive various changes and modifications of the present invention within the scope of the technical concept of the invention, and naturally, such changes and modifications are encompassed by the scope of the present invention. For example, if a skilled person adds/deletes/alters a structural element or design to/from/in the above-described embodiments, or adds/deletes/alters a step or a condition to/from/in the above-described embodiment, as long as they fall within the scope and spirit of the present invention, such addition, deletion, and altercation are encompassed by the scope of the present invention.

Furthermore, regarding the present embodiments, any advantage and effect those will be obvious from the description of the specification or arbitrarily conceived by a skilled person are naturally considered achievable by the present invention.

What is claimed is:

1. A semiconductor device comprising:
    an insulating substrate;
    a first insulating layer disposed above the insulating substrate;
    an island-shaped oxide semiconductor disposed on the first insulating layer;
    a second insulating layer which covers the oxide semiconductor;
    a gate electrode disposed on the second insulating layer;
    a source electrode and a drain electrode, which are in contact with the oxide semiconductor,
    the oxide semiconductor including:
    a first edge portion intersecting the gate electrode;
    a second edge portion on an opposite side to the first edge portion, which intersects the gate electrode;
    a first area extending along a first direction between the first edge portion and the second edge portion and overlapping the gate electrode;
    a second area located between the first area and the source electrode and along the first edge portion;
    a third area located between the first area and the source electrode and along the second edge portion;
    a fourth area located between the first area and the drain electrode and along the first edge portion;
    a fifth area located between the first area and the drain electrode and along the second edge portion;
    a sixth area surrounded by the first area, the second area and the third area; and
    a seventh area surrounded by the first area, the fourth area, and the fifth area, and
    the first area, the second area, the third area, the fourth area and the fifth area having a higher resistance as compared to the sixth area and the seventh area.

2. The semiconductor device of claim 1, further comprising:
    a third insulating layer which covers the gate electrode, wherein
    the source electrode is in contact with the sixth area via a contact hole penetrating the second insulating layer and the third insulating layer without being in contact with the second area and the third area, and
    the drain electrode is in contact with the seventh area via a contact hole penetrating the second insulating layer and the third insulating layer, without being in contact with the fourth area and the fifth area.

3. The semiconductor device of claim 2, wherein
    the second area, the third area, the fourth area, and the fifth area are connected to the first area.

4. The semiconductor device of claim 3, wherein
    a width of the gate electrode is greater than a width of the first area between the sixth area and the seventh area.

5. The semiconductor device of claim 3, wherein
    a width of the gate electrode is equivalent to a width of the first area between the sixth area and the seventh area.

6. The semiconductor device of claim 5, wherein
    the second area, the third area, the fourth area and the fifth area overlap the gate electrode.

7. The semiconductor device of claim 2, wherein
the second area, the third area, the fourth area and the fifth area are spaced apart from the first area.

8. The semiconductor device of claim 7, further comprising:
island-shaped metal layers overlapping the second area, the third area, the fourth area and the fifth area, respectively,
wherein
the metal layers are formed of a same material as that of the gate electrode.

9. The semiconductor device of claim 8, wherein
each of the metal layers does not overlap any of the gate electrode, the source electrode and the drain electrode in planar view.

10. The semiconductor device of claim 1, wherein
an impurity concentration of each of the sixth area and the seventh area is higher than that of each of the first area, the second area, the third area, the fourth area and the fifth area.

* * * * *